United States Patent
Aipperspach et al.

(10) Patent No.: US 7,318,209 B2
(45) Date of Patent: Jan. 8, 2008

(54) PULSE-WIDTH LIMITED CHIP CLOCK DESIGN

(75) Inventors: Anthony Gus Aipperspach, Rochester, MN (US); David William Boerstler, Round Rock, TX (US); Dieter Wendel, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 230 days.

(21) Appl. No.: 10/616,881

(22) Filed: Jul. 10, 2003

(65) Prior Publication Data

US 2005/0010885 A1  Jan. 13, 2005

(51) Int. Cl.
*G06F 17/50* (2006.01)

(52) U.S. Cl. .............................................. 716/6; 716/1

(58) Field of Classification Search .................... 716/1, 716/6, 11, 17; 709/248
See application file for complete search history.

(56) References Cited

U.S. PATENT DOCUMENTS 5,535,337 A * 7/1996 Hogan et al. ................ 709/248
6,704,908 B1 * 3/2004 Horan et al. ..................... 716/1

\* cited by examiner

*Primary Examiner*—Thuan Do
(74) *Attorney, Agent, or Firm*—Carr LLP; D'Ann N. Rifai (57) ABSTRACT

A method and an apparatus are provided for limiting a pulse width in a chip clock design of a circuit. The circuit receives a clock signal having a clock pulse width. The clock pulse width of the clock signal is detected. It is determined whether the clock pulse width is larger than a maximum clock pulse width. Upon a determination that the clock pulse width is larger than a maximum clock pulse width, the clock pulse width of the clock signal is limited.

24 Claims, 12 Drawing Sheets

PULSE-WIDTH LIMITED CHIP CLOCK DESIGN

BACKGROUND OF THE INVENTION

1. Field of the Invention

The invention relates generally to electrical and electronic circuit designs and, more particularly, to a chip clock design that accommodates low frequency or testing environments without sacrificing performance for the normal design environments.

2. Description of the Related Art

As transistors reduce in size in the newer metal-oxide-silicon field-effect transistor (MOSFET) technologies, $T_{OX}$ (i.e., thickness of the oxide layer) and threshold voltage have also been reducing. When $T_{OX}$ and threshold voltages reduce, there is an increase in leakage currents. Additionally, during chip manufacturing, the transistors are exposed to testing temperatures and voltages. This exposure causes the leakage currents to increase dramatically. Typically, these tests are performed at low frequencies. Low frequency tests, under extreme leakage conditions, make it very difficult to design dynamic logic circuits, because the dynamic logic circuits must be in the evaluation or testing phase for an extended period of time. To insure that the dynamic circuits do not discharge unintentionally due to the excessive exposure to testing environments, it must be considered how much leakage current the dynamic nodes in the dynamic circuits are exposed to. Conventionally, more keeper devices are used to insure functionality under the extreme test conditions. Using an increased number of keeper devices, however, causes the nominal environment performance to suffer.

Therefore, there is a need for a circuit design that accommodates low frequency or testing environments without sacrificing performance for the normal design environments.

SUMMARY OF THE INVENTION

The present invention provides a method and an apparatus for limiting a pulse width in a chip clock design of a circuit. The circuit receives a clock signal having a clock pulse width. The clock pulse width of the clock signal is detected. It is determined whether the clock pulse width is larger than a maximum clock pulse width. Upon a determination that the clock pulse width is larger than a maximum clock pulse width, the clock pulse width of the clock signal is limited.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, it will be apparent to those skilled in the art that the present invention may be practiced without such specific details. In other instances, well-known elements have been illustrated in schematic or block diagram form in order not to obscure the present invention in unnecessary detail.

It is further noted that, unless indicated otherwise, all functions described herein may be performed in either hardware or software, or some combinations thereof. In a preferred embodiment, however, the functions are performed by a processor such as a computer or an electronic data processor in accordance with code such as computer program code, software, and/or integrated circuits that are coded to perform such functions, unless indicated otherwise.

In the remainder of this description, a processing unit (PU) may be a sole processor of computations in a device. In such a situation, the PU is typically referred to as an MPU (main processing unit). The processing unit may also be one of many processing units that share the computational load according to some methodology or algorithm developed for a given computational device. For the remainder of this description, all references to processors shall use the term MPU whether the MPU is the sole computational element in the device or whether the MPU is sharing the computational element with other MPUs, unless indicated otherwise.

Figure 1:
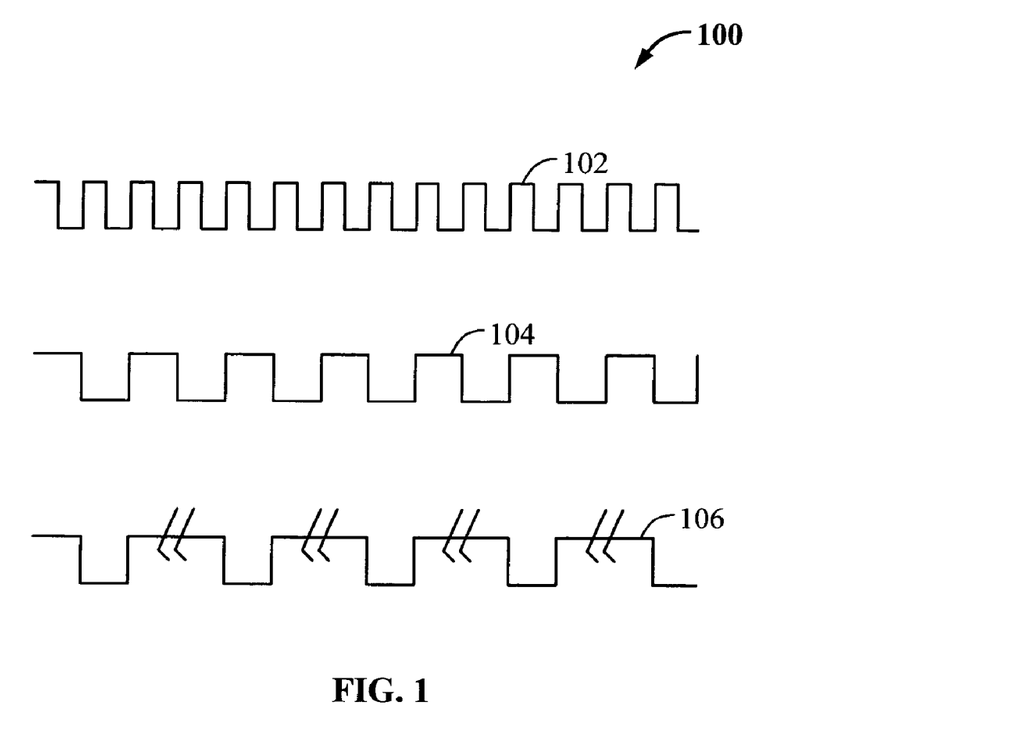
FIG. 1 illustrates clock pulses at various frequencies designed to accommodate low frequency or testing environments without sacrificing performance for a normal design environment.

Referring to FIG. 1 of the drawings, the reference numeral 100 generally designates clock pulses at various frequencies designed to accommodate low frequency or testing environments without sacrificing performance for a normal design environment. Shown are three example clock pulses 102, 104, and 106. The clock pulses 102 represent clock pulses at normal speed. At normal speed, the clock is unaffected.

The clock pulses 104 represent clock pulses at reduced speed but before a maximum pulse width (not shown) is reached. As the clock frequency is slowed but before the maximum pulse width is reached, the duty factor stays the same as the duty factor provided by a phase-locked loop (PLL) (not shown). Typically, the maximum pulse width varies for different circuits under test. Preferably, the maximum pulse width is determined by the leakage current characteristics of a particular circuit under test and is quantifiable with the number of standard inverter delays. For example, certain circuits under test may have a maximum pulse width equivalent to a pulse width of 15 to 20 standard inverter delays.

The clock pulses 106 represent clock pulses at further reduced speed such that the pulse width reached the maximum pulse width and was further increased. As the frequency is further reduced from the point where the maximum pulse width is reached, the pulse width of the leading clock edge is limited by the present invention. In other words, the clock pulses 106 show that the duty cycle of the clock pulses 106 is altered.

Additional advantages of the present invention include that the present invention enables a chip clock design to have one design point for both high frequency and low frequency applications.

Figure 2:
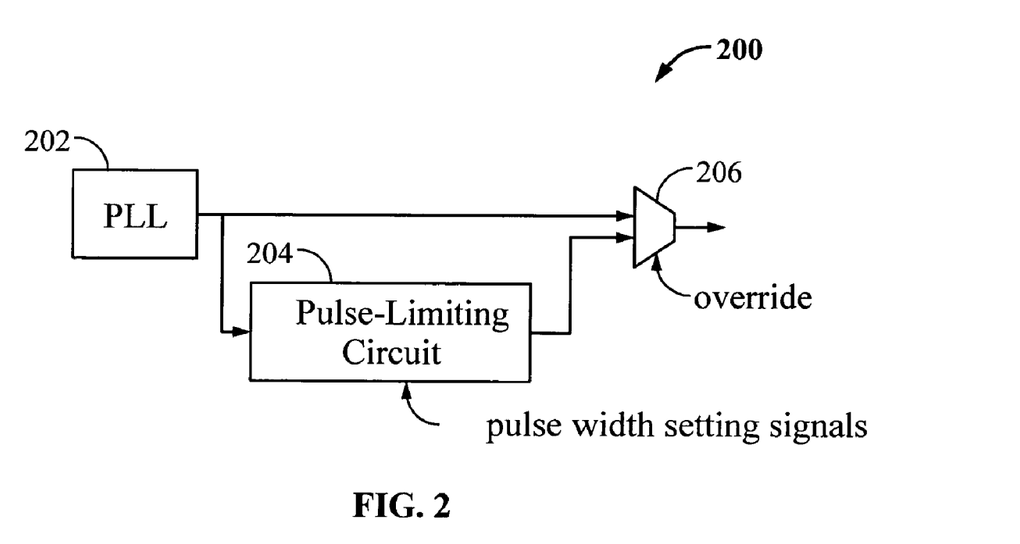
FIG. 2 illustrates a block diagram showing a general clocking scheme used to accomplish the clock pulses of FIG. 1.

In FIG. 2, a block diagram shows a general clocking scheme 200 used to accomplish the clock pulses of FIG. 1. The general clocking scheme 200 includes a phase-locked loop (PLL) 202, a pulse-limiting circuit 204, and optionally an override circuit 206. The PLL 202 is coupled to the pulse-limiting circuit 204 and the optional override circuit 206. The pulse-limiting circuit 204 is coupled to the override circuit 206 and receives a pulse width setting signal. The pulse width setting signal determines the maximum pulse width discussed above in reference to FIG. 1 and is preferably adjustable. The override circuit 206 receives an override signal to select an output signal from the PLL 202 and the pulse-limiting circuit 204.

Figure 3:
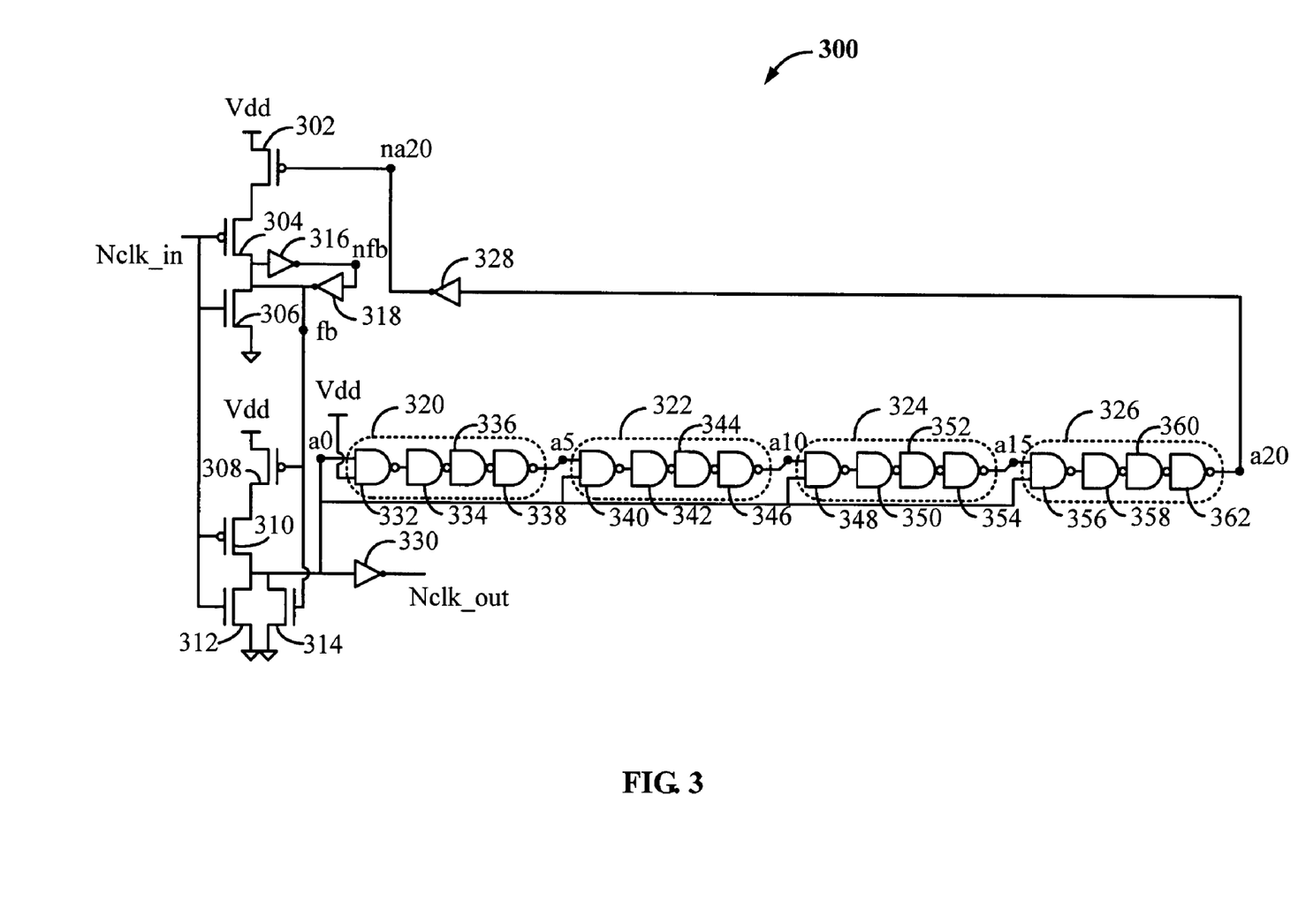
FIG. 3 illustrates a schematic diagram showing a preferred embodiment of a pulse-limiting circuit of FIG. 2.

Now referring to FIG. 3, a schematic diagram shows a preferred embodiment 300 of the pulse-limiting circuit 204 of FIG. 2. The pulse-limiting circuit 300 generally comprises a first p-channel metal-oxide-silicon (PMOS) transistor 302, a second PMOS 304, a first n-channel metal-oxide-silicon (NMOS) transistor 306, a third PMOS 308, a fourth PMOS 310, a second NMOS 312, a third NMOS 314, a first inverter 316, a second inverter 318, a first delay block 320, a second delay block 322, a third delay block 324, a fourth delay block 326, a third inverter 328, and a fourth inverter 330. The delay block 320 includes four NAND gates 332, 334, 336, and 338 coupled in series. Similarly, the delay block 322 includes four NAND gates 340, 342, 344, and 346 coupled in series. The delay block 324 includes four NAND gates 348, 350, 352, and 354 coupled in series. The delay block 326 includes four NAND gates 356, 358, 360, and 362 coupled in series.

Although it is shown to include four delay blocks 320, 322, 324, and 326, the pulse-limiting circuit 300 may generally have a plurality of delay blocks to perform the intended function of the present invention. For example, the pulse-limiting circuit 300 may have the first delay block 320 and only one of the remaining three delay blocks. For the sake of convenience, these four delay blocks 320, 322, 324, and 326 are collectively referenced herein as delay blocks 320-326.

The first PMOS 302 is coupled to the supply voltage Vdd and the second PMOS 304 to pull up the source of the second PMOS 304 to Vdd when the output of the third inverter 328 is low. The second PMOS 304 is also coupled to the first NMOS 306 and is configured to be gated by an Nclk_in signal. The first NMOS 306 is coupled to ground and is configured to be gated by the Nclk_in signal. The output of the first inverter 316 is coupled to the input of the second inverter 318, the output of which is also coupled to the input of the first inverter 316. Node nfb is shown as the output of the first inverter 316, whereas node fb is shown as the output of the second inverter 318.

The third PMOS 308 is coupled between Vdd and the source terminal of the fourth PMOS 310 and is gated by node fb. Thus, when node fb is low, the third PMOS 308 pulls up the source of the fourth PMOS 310 to Vdd. The fourth PMOS 310 is also coupled to both the drain terminals of the second NMOS 312 and the third NMOS 314 and is gated by Nclk_in. The second NMOS 312 and the third NMOS 314 are coupled in parallel between the drain terminal of the fourth PMOS 310 and ground. The second PMOS 304, the first NMOS 306, the fourth PMOS 310, and the second NMOS 312 are all gated by Nclk_in. Both the third PMOS 308 and the third NMOS 314 are gated by node fb.

The first delay block 320 is coupled to Vdd and the drains of the second NMOS 312 and the third NMOS 314. Node a0 is shown to indicate one input to the first delay block 320. Specifically, the NAND gate 332 is coupled to both Vdd and node a0. Therefore, the NAND gate 332 functions as an inverter. The output of the first delay block 320 is shown as node a5. The NAND gate 340 is coupled to both nodes a0 and a5. Similarly, the output of the second delay block 322 is shown as node a10. The NAND gate 348 is coupled to both nodes a0 and a10. Likewise, the output of the third delay block 324 is shown as node a15. The NAND gate 356 is coupled to both nodes a0 and a15. The output of the fourth delay block 326 is shown as node a20, which is coupled to the input of the third inverter 328. The fourth inverter 330 is coupled to node a0 and generates an inverted signal of node a0 as Nclk_out.

The pulse-limiting circuit 300 assumes the down pulse is the one that is to be limited. A similar pulse-limiting circuit for limiting the up pulse may be apparently derived from the pulse-limiting circuit 300. Initially, the "nclk_in" signal is high. Nodes a0-a20 are low, and the feedback signal "fb" is low. As nclk_in goes to low, node a0 goes to high. After some delay, node a5 goes to high. Subsequently, nodes a10, a15, and a20 go to high sequentially. When node a20 goes high, node na20 goes low, turning on the first PMOS 302. This in turn drives node fb high. When node fb goes high, node a0 returns low again, forcing the output "nclk_out" to go high. The down pulse of the "nclk_out" signal is limited to the loop delay of the circuit. Since node a0 is passed to multiple points in the delay chain consisting of the delay blocks, the chain resets very quickly, causing node a20 to go low again, to get ready for the next input clock cycle. The node fb is designed to reset the nclk_out high but not low. Only the input clock "nclk_in" can reset the nclk_out low.

In the case where the input clock "nclk_in" has a pulse width shorter than the loop delay, the nclk_in is passed directly to nclk_out via the input devices, since node fb never goes high. This is because the loop resets much faster than its sets, and thus the transition of node a20 is blocked.

It is noted that there are many different ways to implement each delay block without departing from the true spirit of the invention. Also note that NAND gates in these four delay blocks are replaceable with an inverter or other forms of delay elements.

As briefly mentioned above, PMOS and NMOS stand for p-channel and n-channel metal-oxide-silicon transistors, respectively. MOS transistors are field effect transistors (FETs) and generally have gate, source, and drain terminals. Detailed explanation of orientations and/or connections of PMOS and NMOS transistors with respect to these terminals are well known in the art from the symbols used to represent these transistors and thus may be omitted herein in order not to unnecessarily complicate the description. Since PMOS and NMOS transistors described herein primarily function as digital switches, the present invention should be considered to cover different implementations using such switches in place of the PMOS and NMOS transistors without departing from the true spirit of the present invention.

Figure 3A:
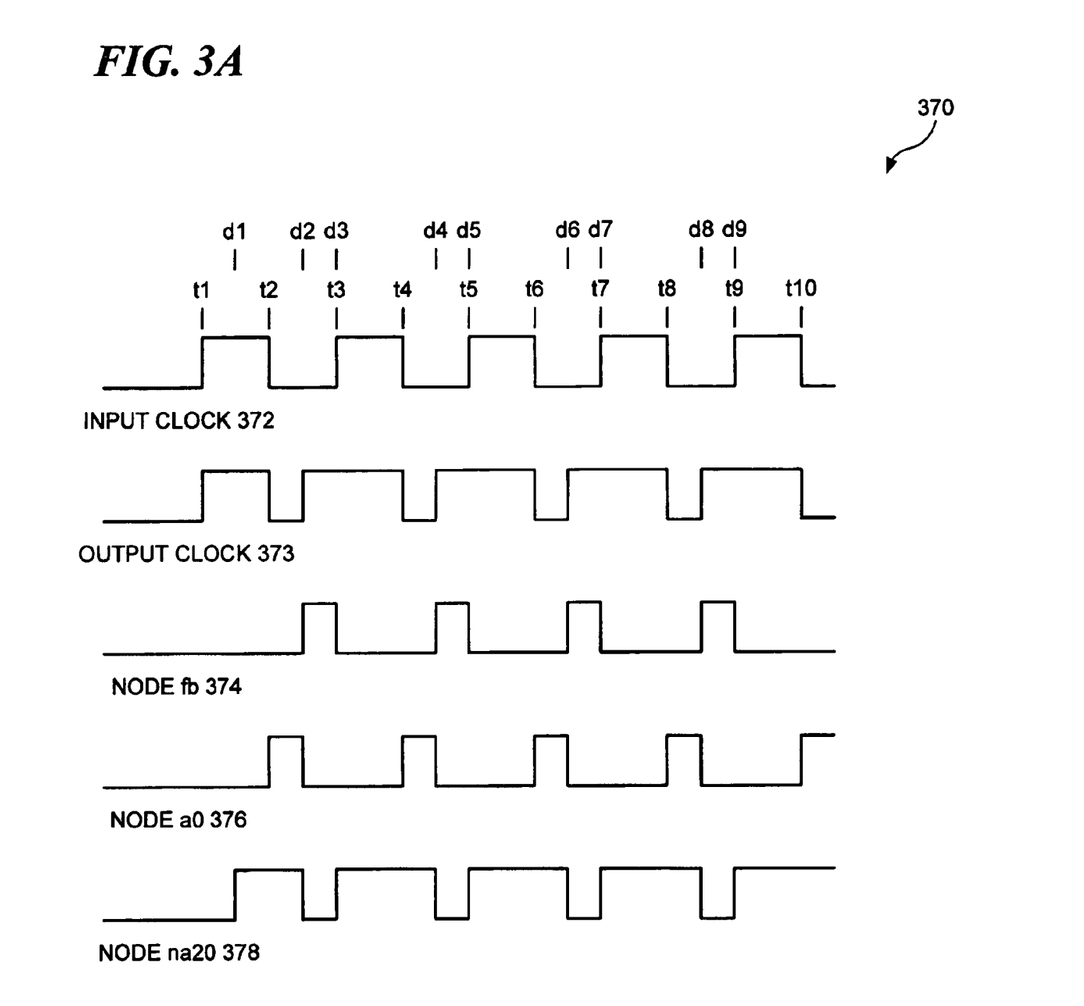
FIG. 3A illustrates a timing diagram showing various signals of the preferred embodiment of FIG. 3.

Now referring to FIG. 3A, the reference numeral 370 generally refers to a timing diagram showing various signals of the embodiment as illustrated in FIG. 3. One skilled in the art will understand that the timing diagram describes the logic states of various signals over an operational time period. As such, one skilled in the art can derive a similar timing diagram based solely on FIG. 3 depending on the skill of the artisan, a mental timing diagram can be derived that tracks the timing diagram offered in FIG. 3A. Accordingly, the timing diagram illustrated in FIG. 3A is offered as a visual aid to understanding, saving time for one skilled in the art seeking to understand the embodiment depicted in FIG. 3.

Certain assumptions have been made in order to simplify description of the operation of the circuit in FIG. 3. First, an arbitrary delay time has been selected that is approximately equal to one-half the pulse width of the input clock. Second, the "delay time" as depicted in FIG. 3A refers to the time it takes for a high-to-low transition at node a0 to propagate through the delay blocks 320-326, through node a20 and inverter 328, to node na20. One skilled in the art will understand that other delay times can also be selected, as described in more detail below. Third, the particular signals shown have been somewhat simplified and depicted as perfectly formed square waves, as one skilled in the art will understand. As described above, FIG. 3A is offered in an effort to simplify and aid understanding of the preferred embodiment and the claims thereto.

In particular, FIG. 3A illustrates an input clock 372. Input clock 372 is a square wave with a pulse width of ($t_2$-$t_1$). As illustrated, input clock 372 goes high at time $t_1$, and low at time $t_2$. At time t1, when input clock goes high, PMOS 304 and PMOS 310 are turned "on" and NMOS 306 and 310 are turned "off." One skilled in the art will understand that, as used herein, turning "on" or "off" a particular PMOS or NMOS refers to applying the enabling (for "on") or disabling (for "off") gate voltage to the PMOS/NMOS. Generally, one skilled in the art will understand that as depicted, the PMOSes shown are turned "on" when a logic low voltage is applied to their gates, and the NMOSes shown are turned "on" when a logic high voltage is applied to their gates.

At time t1, output clock 373 is also driven high. Output clock 373 is the output signal, "Nckl_out" of inverter 330 of FIG. 3. As NMOS 312 is on, and PMOS 310 is off, the input to inverter 330, and node a0 376, is low. Additionally, as input clock 372 is high, PMOS 304 is off, and the input to inverter 316 is low. Thus, the output of inverter 316, node nfb, is high and the output of inverter 318, node fb 374, is low.

As illustrated, at time t1 node a0 376 is low. After a delay time, d1, the signal at node a0 propagates through to node na20, on the output side of inverter 328. Thus, at time d1, node na20 378 is high.

At time t2, input clock 372 goes low. As such, NMOS 306 and 312 are off and PMOS 304 and 310 are on. Further, as node fb 374 is low at time t2, PMOS 308 is also on. Thus, node a0 376 goes high (Vdd) and output clock 373 goes low.

At time d2, the transition from low to high at node a0 has propagated to node na20, so node na20 378 goes low. As node na20 378 is low, PMOS 302 is on, and node fb 374 goes high, causing NMOS 314 to turn on and PMOS 308 to turn off. As node fb 374 goes high, node a0 376 goes low and output clock 373 goes high.

At time t3, input clock 372 goes high. As such, NMOS 306 and 312 are on and PMOS 304 and 310 are off. Time t3 is also time d3, in that the transition from high to low at node a0 has propagated to node na20, so node na20 378 goes high. As such, PMOS 302 turns off, and node fb 374 goes low.

At time t4, input clock 372 goes low. As such, NMOS 306 and 312 are off and PMOS 304 and 310 are on. Further, as node fb 37 is low at time t4, PMOS 308 is also on, and node a0 376 goes high and output clock 373 goes low.

At time d4, the transition from low to high at node a0 has propagated to node na20, so node na20 378 goes low. As node na20 378 is low, PMOS 302 is on, and node fb 374 goes high, causing NMOS 314 to turn on and PMOS 308 to turn off. As node fb 374 goes high, node a0 376 goes low and output clock 373 goes high.

At time t5, input clock 372 goes high. As such, NMOS 306 and 312 are on and PMOS 304 and 310 are off. Time t5 is also time d5, in that the transition from high to low at node a0 has propagated to node na20, so node na20 378 goes high. As such, PMOS 302 turns off, and node fb 374 goes low.

At time t6, input clock 372 goes low. As such, NMOS 306 and 312 are off and PMOS 304 and 310 are on. Further, as node fb 37 is low at time t6, PMOS 308 is also on, and node a0 376 goes high and output clock 373 goes low.

At time d6, the transition from low to high at node a0 has propagated to node na20, so node na20 378 goes low. As node na20 378 is low, PMOS 302 is on, and node fb 374 goes high, causing NMOS 314 to turn on and PMOS 308 to turn off. As node fb 374 goes high, node a0 376 goes low and output clock 373 goes high.

At time t7, input clock 372 goes high. As such, NMOS 306 and 312 are on and PMOS 304 and 310 are off. Time t7 is also time d7, in that the transition from high to low at node a0 has propagated to node na20, so node na20 378 goes high. As such, PMOS 302 turns off, and node fb 374 goes low.

At time t8, input clock 372 goes low. As such, NMOS 306 and 312 are off and PMOS 304 and 310 are on. Further, as node fb 37 is low at time t8, PMOS 308 is also on, and node a0 376 goes high and output clock 373 goes low.

At time d8, the transition from low to high at node a0 has propagated to node na20, so node na20 378 goes low. As node na20 378 is low, PMOS 302 is on, and node fb 374 goes high, causing NMOS 314 to turn on and PMOS 308 to turn off. As node fb 374 goes high, node a0 376 goes low and output clock 373 goes high.

At time t9, input clock 372 goes high. As such, NMOS 306 and 312 are on and PMOS 304 and 310 are off. Time t9 is also time d9, in that the transition from high to low at node a0 has propagated to node na20, so node na20 378 goes high. As such, PMOS 302 turns off, and node fb 374 goes low.

One skilled in the art will appreciate that the above sequence of events can repeat as often as necessary and/or desired as enabled by the particular circuit depicted in FIG. 3.

Figure 4:
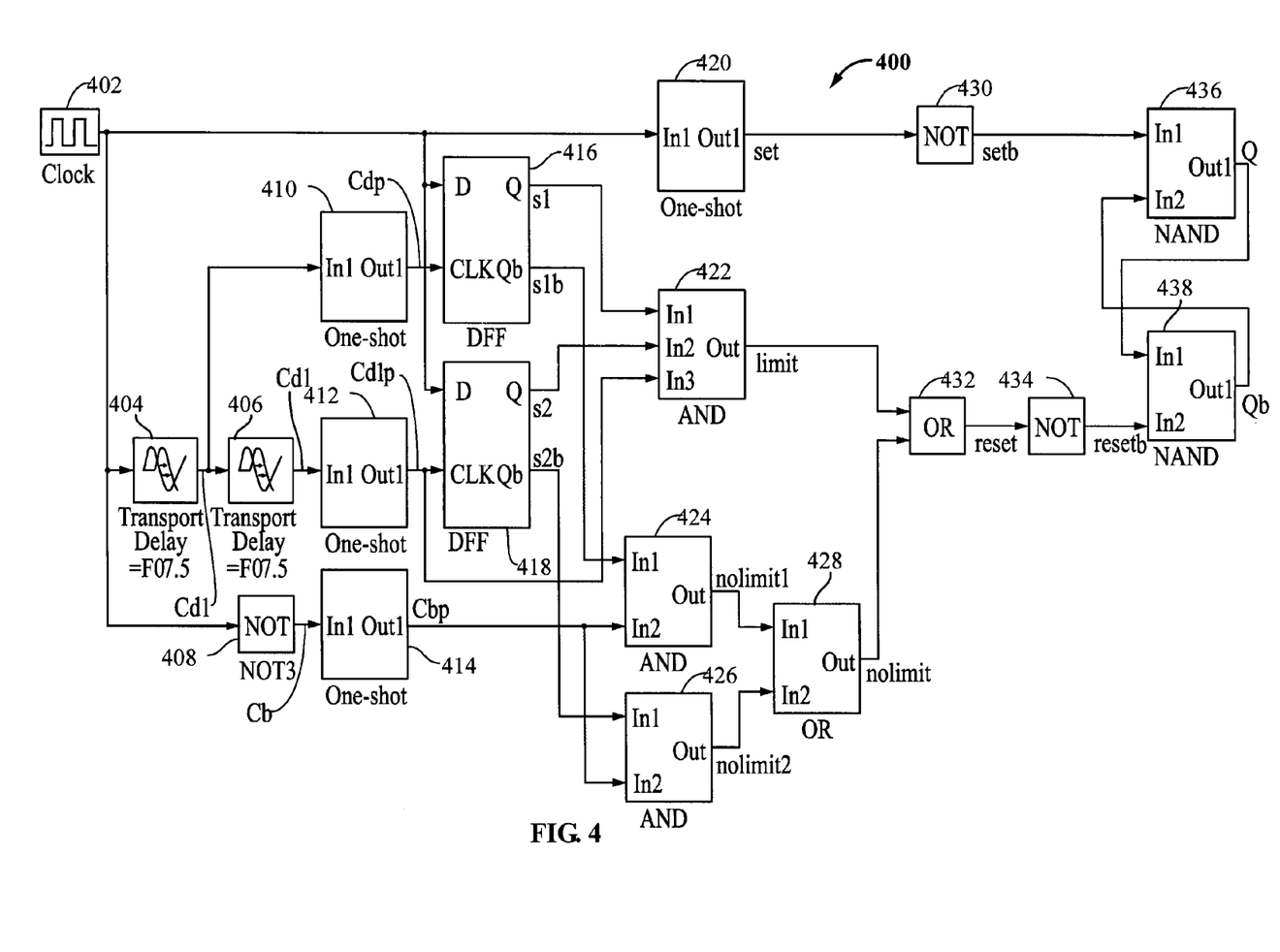
FIG. 4 illustrates a schematic diagram showing an alternative embodiment of a pulse-limiting circuit of FIG. 2.
Figure 5:
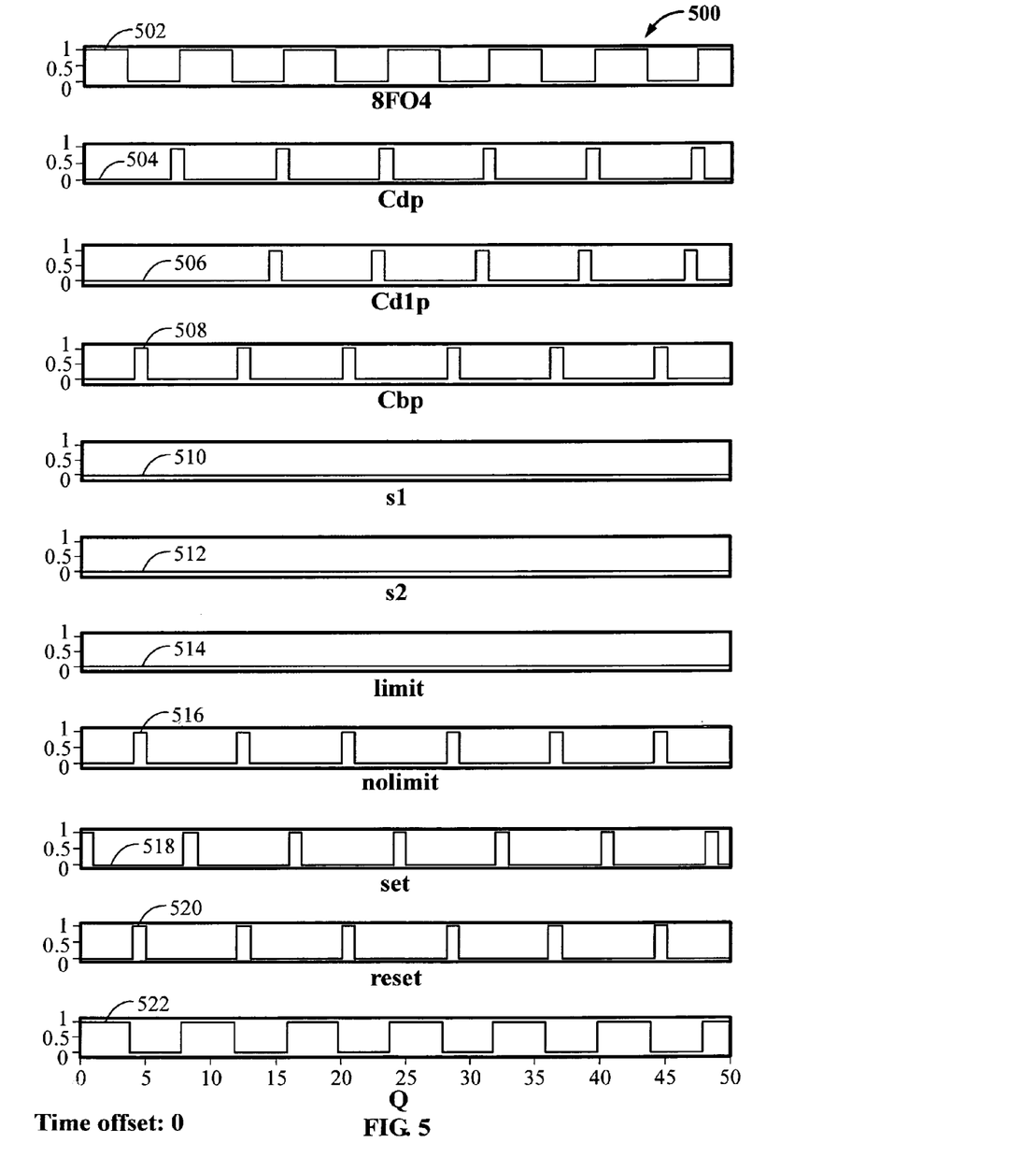
FIG. 5 illustrates a timing diagram showing various signals of the alternative embodiment of FIG. 4 when there is an 8FO4 delay in the input signal.
Figure 6:
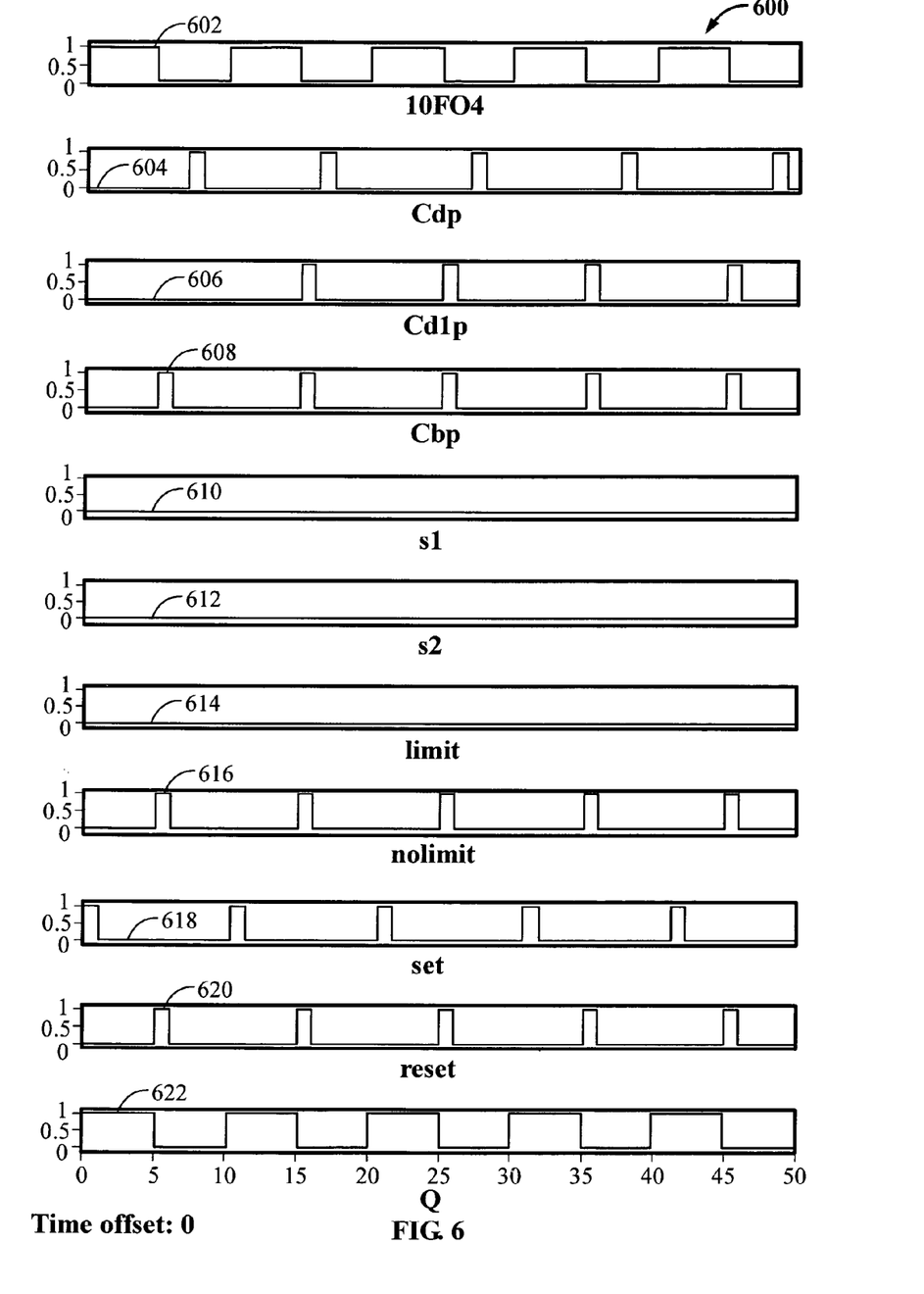
FIG. 6 illustrates a timing diagram showing various signals of the alternative embodiment of FIG. 4 when there is a 10FO4 delay in the input signal.
Figure 7:
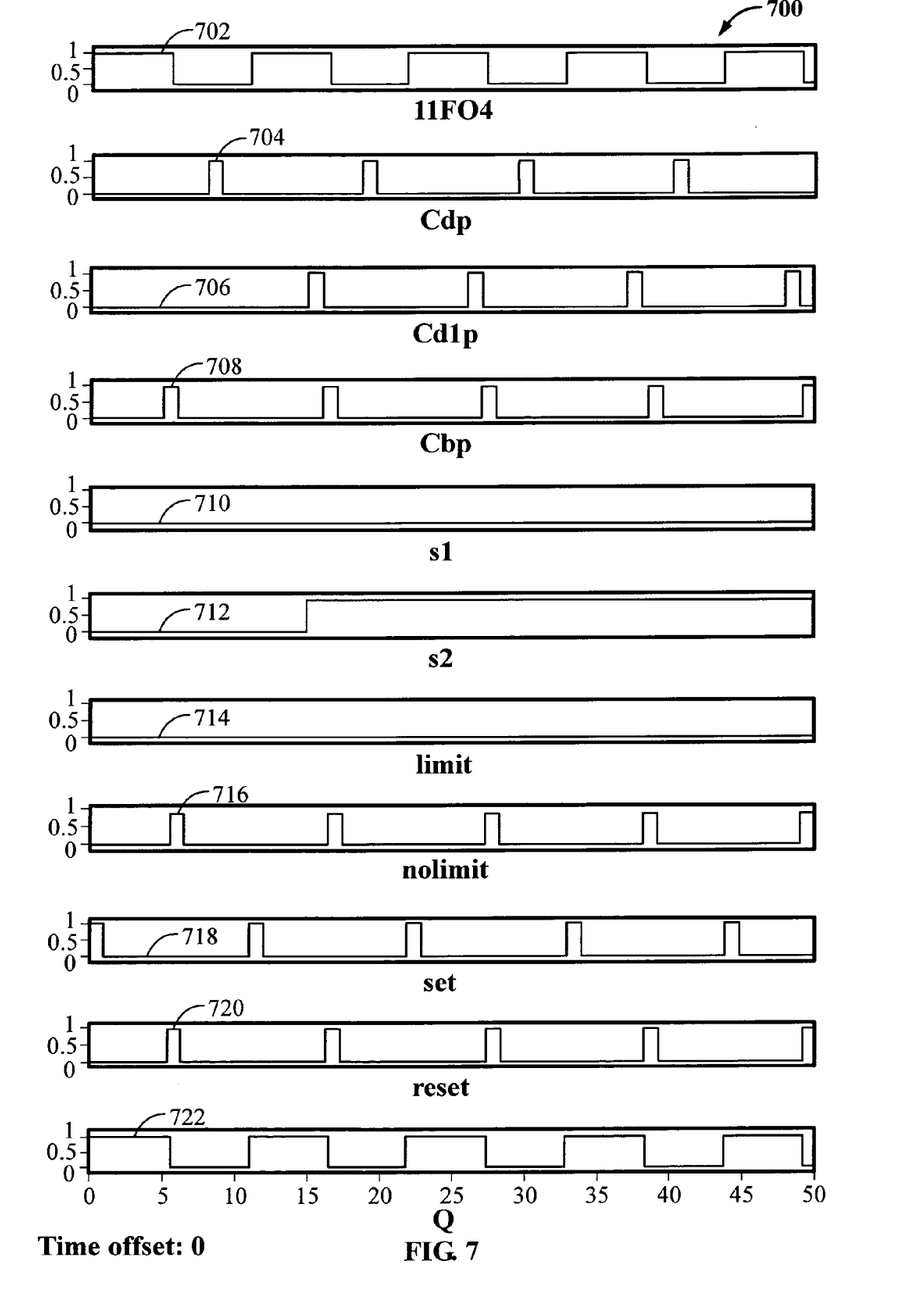
FIG. 7 illustrates a timing diagram showing various signals of the alternative embodiment of FIG. 4 when there is an 11FO4 delay in the input signal.
Figure 8:
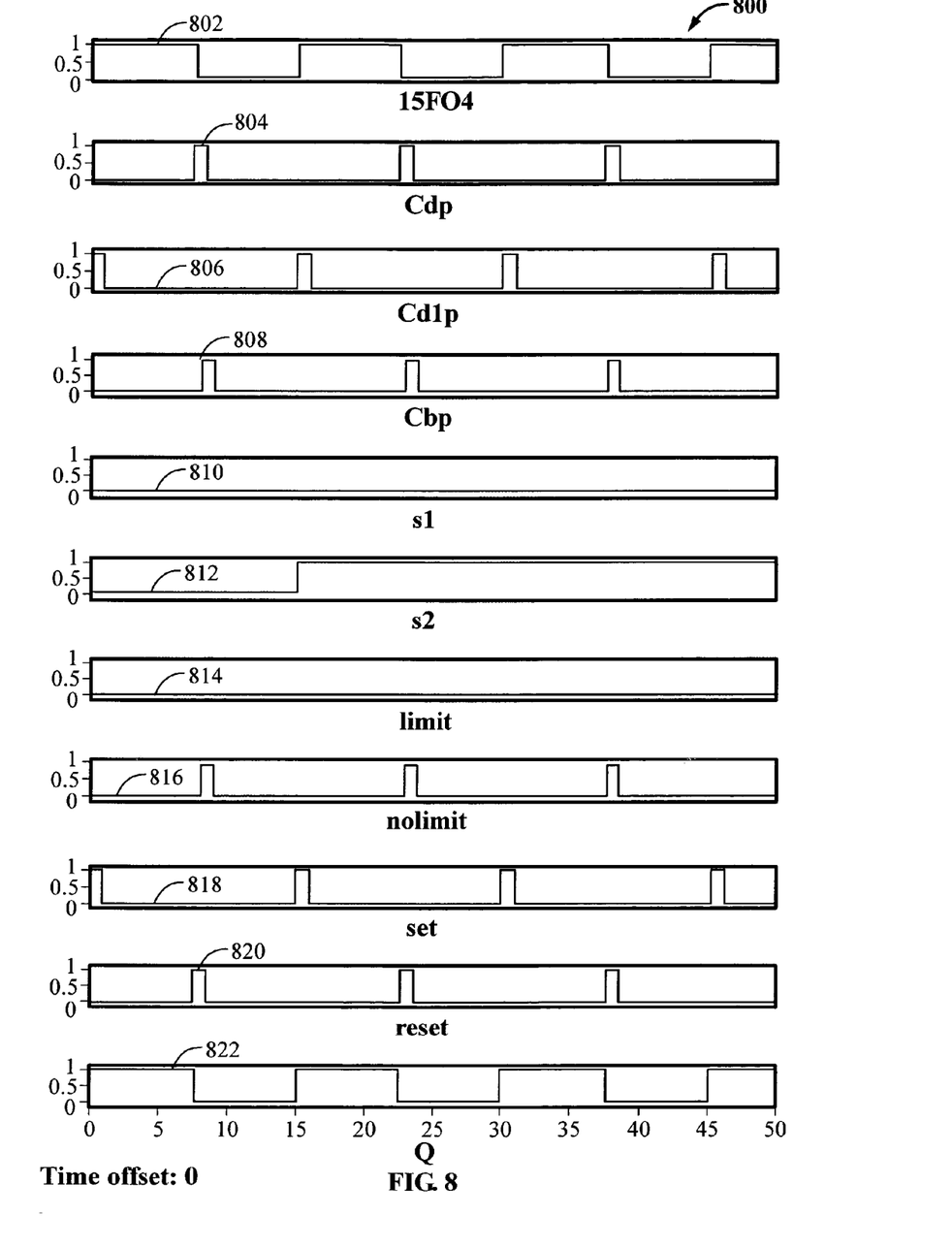
FIG. 8 illustrates a timing diagram showing various signals of the alternative embodiment of FIG. 4 when there is a 15FO4 delay in the input signal.
Figure 9:
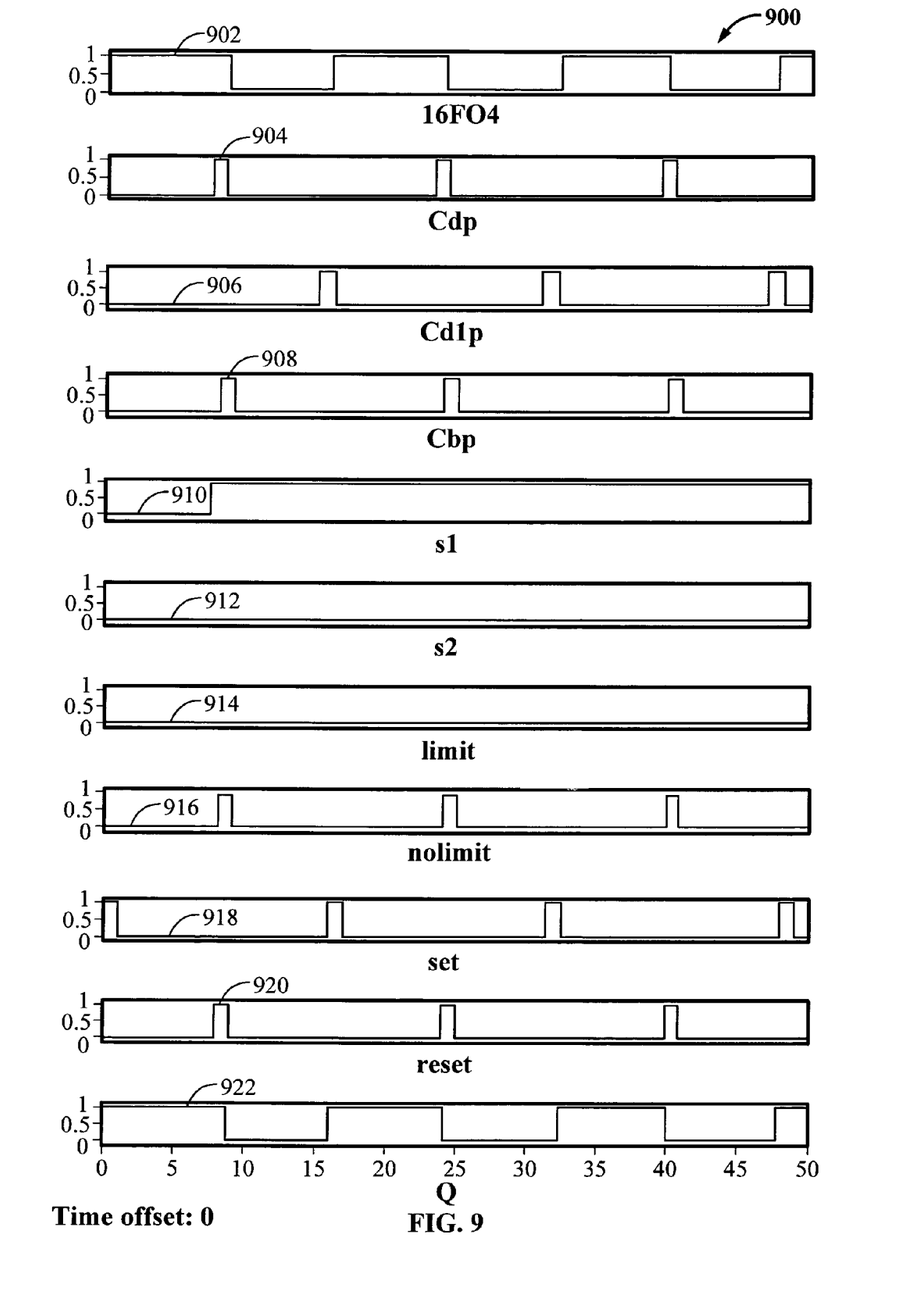
FIG. 9 illustrates a timing diagram showing various signals of the alternative embodiment of FIG. 4 when there is a 16FO4 delay in the input signal.
Figure 10:
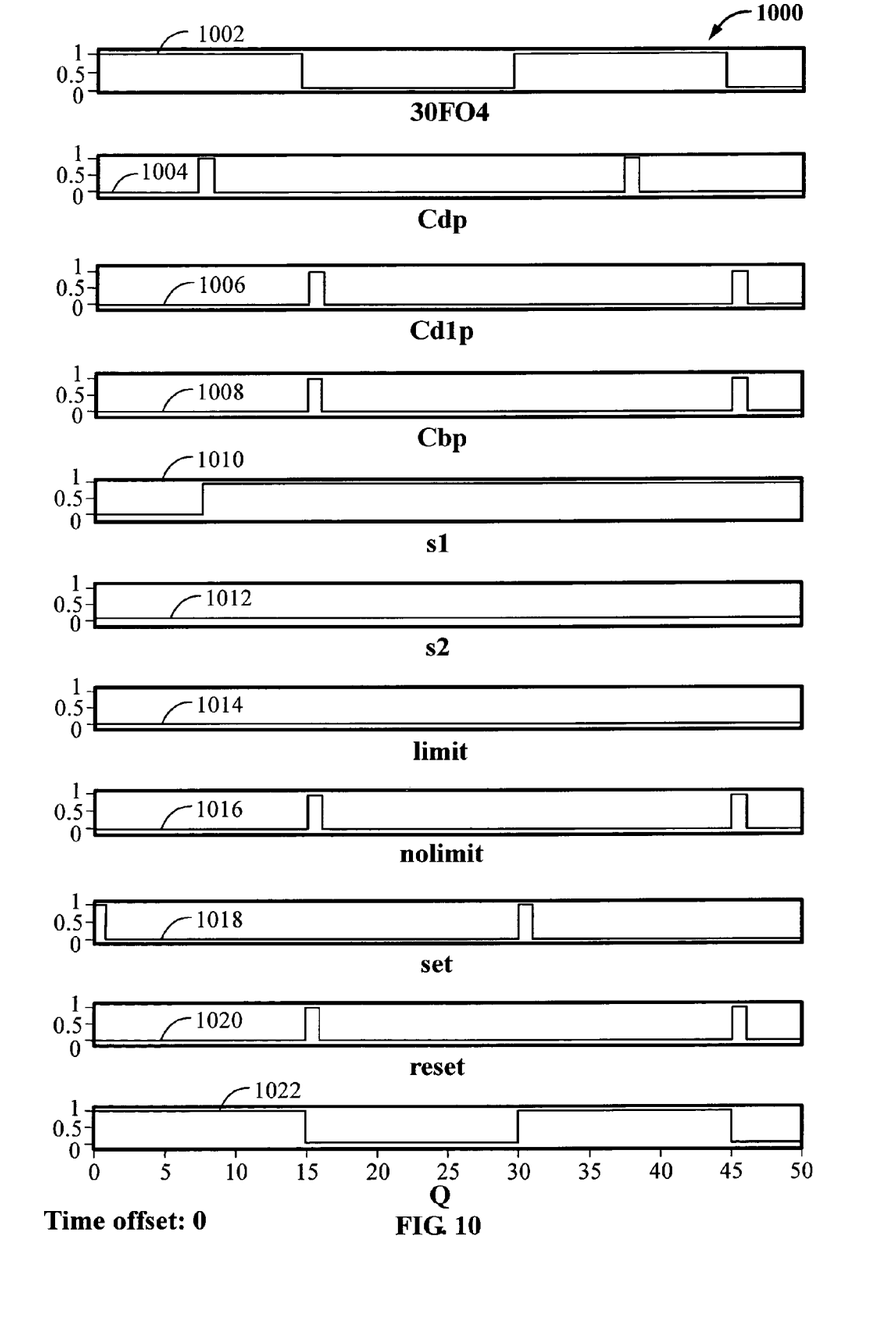
FIG. 10 illustrates a timing diagram showing various signals of the alternative embodiment of FIG. 4 when there is a 30FO4 delay in the input signal.
Figure 11:
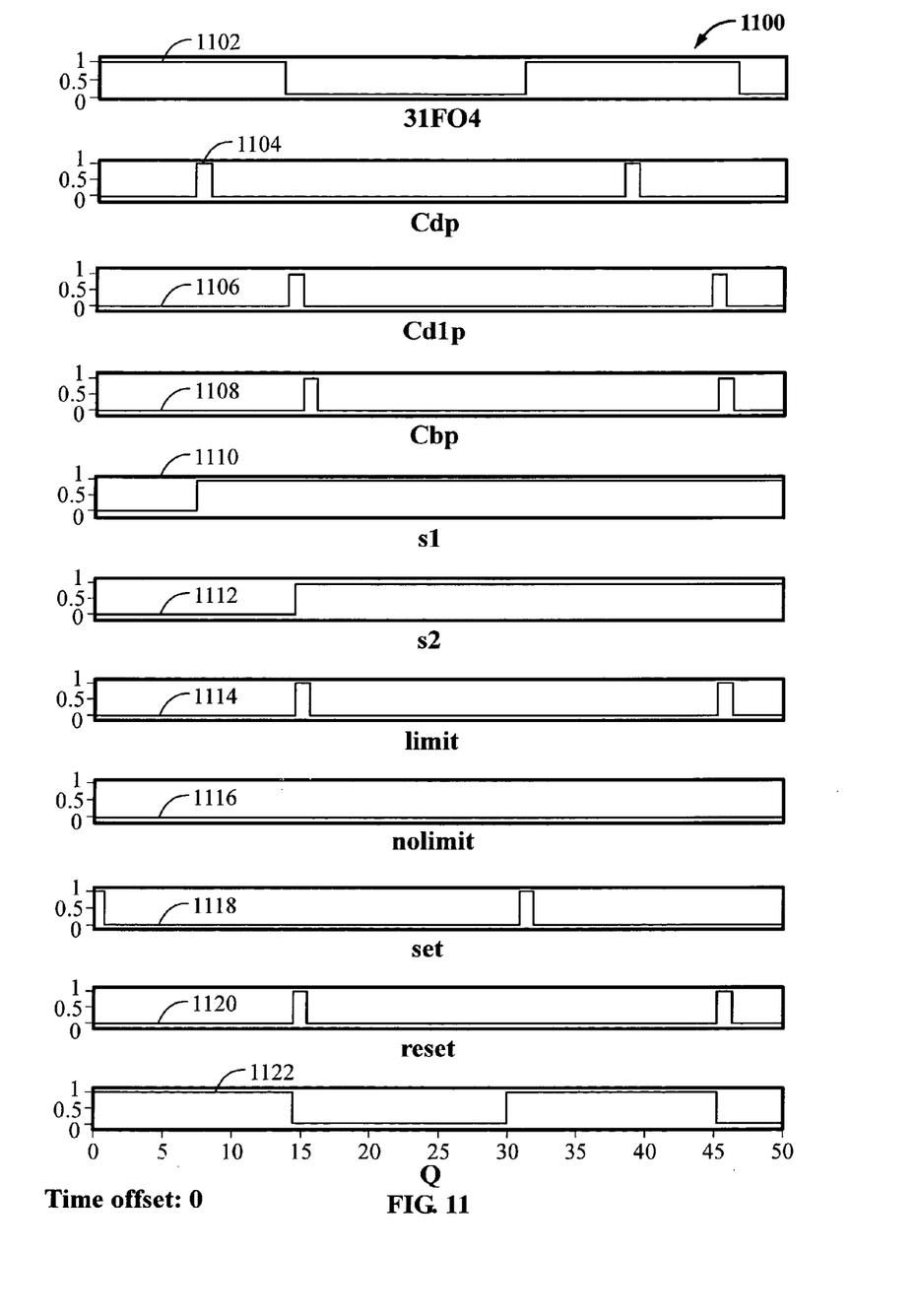
FIG. 11 illustrates a timing diagram showing various signals of the alternative embodiment of FIG. 4 when there is a 31FO4 delay in the input signal.
Figure 12:
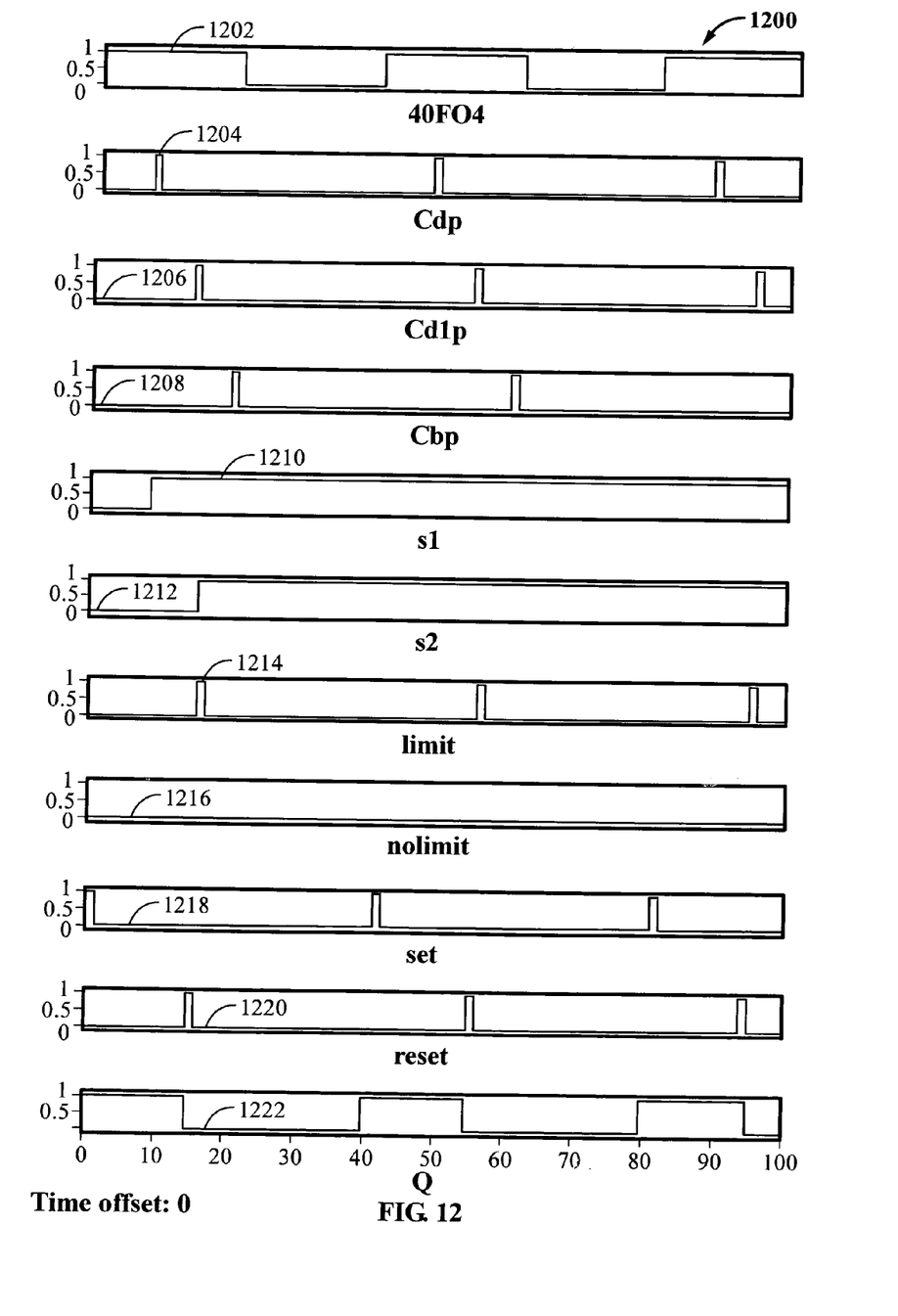
FIG. 12 illustrates a timing diagram showing various signals of the alternative embodiment of FIG. 4 when there is a 40FO4 delay in the input signal.

Now referring to FIG. 4, a schematic diagram shows an alternative embodiment 400 of the pulse-limiting circuit of FIG. 2. The pulse-limiting circuit 400 receives an input clock signal 402, and includes a first transport delay 404, a second transport delay 406, a first NOT logic 408, a first one-shot logic 410, a second one-shot logic 412, a third one-shot logic 414, a first D flip-flop (DFF) 416, a second D flip-flop (DFF) 418, a fourth one-shot logic 420, a first AND logic 422, a second AND logic 424, a third AND logic 426, a first OR logic 428, a second NOT logic 430, a second OR logic 432, a third NOT logic 434, a first NAND logic 436, and a second NAND logic 438.

The input clock 402 is coupled to the first transport delay 404, a first NOT logic 408, a first DFF 416, a second DFF 418, and a fourth one-shot logic 420 to provide the input clock pulse of the input clock 402. The first transport delay 404 generates a Cd1 signal, which is a delayed signal of the input clock pulse by a delay amount of 7.5FO4. This delay amount refers to the delay of 7.5 inverters with four inverters like itself as output loads. For example, 1FO4 represents the delay of one inverter with fan-out of four. FO is a relative unit of delay, independent of technology and may be replaced with other measures of delay.

The first transport delay 404 is coupled to the second transport delay 406 and the first one-shot logic 410 to provide the Cd1 signal. The first one-shot logic 410 generates a Cdp signal by creating a pulse from a single edge of the Cd1 signal. The second transport delay 406 is coupled to the second one-shot logic 412 to provide the Cd1 signal. The second one-shot logic 412 generates a same Cd1p signal. The first NOT logic 408 is coupled to the third one-shot logic 414 to provide a Cb signal. The third one-shot logic 414 also generates a Cbp signal.

The first DFF 416 is coupled to the first one-shot 410 for receiving the Cdp signal from the first one-shot logic 410 as a clock input. The first DFF 416 is also coupled to the input clock 402 for receiving the input signal as a data input. Similarly, the second DFF 418 is coupled to the second one-shot logic 412 for receiving the Cd1p signal as a clock input and is also coupled to the input clock 402 for receiving the input signal as a data input. The first DFF 416 generates an S1 signal as a data output and an S1b signal as an inverted data output. The second DFF 418 generates an S2 signal as a data output and an S2b signal as an inverted data output.

The fourth one-shot logic 420 generates a SET signal. The first AND logic 422 is coupled to the first DFF 416, the second DFF 418, and the second one-shot logic 412 for receiving the S1, S2, and Cd1p signals. The first AND logic 422 generates a LIMIT signal. The second AND logic 424 is coupled to the first DFF 416 for receiving the S1b signal and is also coupled to the third one-shot logic 414 for receiving the Cbp signal. The third AND logic 426 is coupled to the second DFF 418 for receiving the S2b signal and is coupled to the third one-shot logic 414 for receiving the Cbp signal. The second NOT logic 430 is coupled to the fourth one-shot logic 420 for receiving the SET signal and generates a SETB signal. The first OR logic 428 is coupled to the second AND logic 424 and to the third AND logic 426 for receiving a NOLIMIT1 signal and a NOLIMIT2 signal, respectively. The first OR logic 428 generates a NOLIMIT signal.

The second OR logic 432 is coupled to the first AND logic 422 for receiving the LIMIT signal and is coupled to the first OR logic 428 for receiving the NOLIMIT signal. The second OR logic 432 generates a RESET signal. The third NOT logic 434 is coupled to the second OR logic 432 for receiving the RESET signal and generates a RESETB signal. The first NAND logic 436 is coupled to the second NOT logic 430 for receiving the SETB signal. The second NAND logic 438 is coupled to the third NOT logic 434 for receiving the RESETB signal. The first NAND logic 436 and the second NAND logic 438 are coupled to each other such that the output of one logic is fed back to the input of the other logic. The first NAND logic 436 and the second NAND logic 438 generate outputs Q and Qb, respectively. Note that the output Q of FIG. 4 corresponds to the output of the pulse-limiting circuit 204 of FIG. 2.

There are two delays, one at 7.5FO4 and the other at 15FO4. Pulsed-latches latch the value of the clock at these two delays. If they are both high, pulse-width limiting should be used. This corresponds to 30FO4 and longer cycle times. There is duty cycle sensitivity at 7.5FO4, 15FO4, and 30FO4, which exact cycle times should be avoided.

Now referring to FIGS. 5 through 12, timing diagrams 500, 600, 700, 800, 900, 1000, 1100, and 1200 are various signals of the alternative embodiment of FIG. 4 when there are various delays in the input signal. The delays in the input signal for FIGS. 5 through 12 are 8FO4, 10FO4, 11FO4, 15FO4, 16FO4, 30FO4, 31FO4, and 40FO4, respectively. Since the pulse-limiting circuit 400 is supposed to affect only signals with 30FO4 and longer cycle times, the output Q is shown to be limited only in FIGS. 11 and 12.

It will be understood from the foregoing description that various modifications and changes may be made in the preferred embodiment of the present invention without departing from its true spirit. This description is intended for purposes of illustration only and should not be construed in a limiting sense. The scope of this invention should be limited only by the language of the following claims.

The invention claimed is:

1. A method of altering a duty cycle of a first clock signal in an integrated circuit having a plurality of switches, comprising:
   receiving, by at least a first portion of the switches, the first clock signal, wherein the first clock signal has a first pulse width;
   in response to the first clock signal transitioning from a first logical state to a second logical state at time t:
      gating a second portion of the switches to transition a second clock signal to the second logical state at substantially time t;
      at substantially time t, propagating a signal in the first logical state through a delay element, wherein the delay element has a propagation delay time t1;
      in response to the propagation delay time t1 being less than the first pulse width of the first clock signal, at substantially the end of time t+t1, gatng a third portion of the switches to transition the signal to the second logical state; and
      in response to the signal transitioning to the second logical state, at substantially the end of time t+t1, transitioning the second clock signal to the first logical state; and
   in response to the clock signal transitioning from the second logical state to the first logical state at time t2:
      gating a fourth portion of the switches such that the second clock signal is in the first logical state at substantially time t2;
      at substantially time t2, propagating the signal in the second logical state through the delay element; and
      in response to the propagation delay time t1 of the delay element being less than the first pulse width of the first clock signal, at substantially the end of time t2+t1, gating a fifth portion of the switches such that the second clock signal does not transition to the second logical state at substantially the end of time t2+t1.

2. The method of claim 1, further comprising:
   in response to the propagation delay time t1 being equal to or greater than the pulse width of the first clock signal, gating a sixth portion of the switches such that the second clock signal transitions in substantial accordance with the first clock signal, such that the duty cycle of the first clock signal is substantially identical to a duty cycle of the second clock signal.

3. The method of claim 1, wherein the first portion of switches comprises four digital switches, wherein two digital switches are gated on and two digital switches are gated off in response to the first clock signal transitioning to the first logical state.

4. The method of claim 1, wherein the delay element comprises at least two delay blocks coupled in series, wherein each delay block inverts the signal.

5. The method of claim 4, wherein each delay block comprises at least a multiple of four NAND gates coupled in series.

6. The method of claim 1, wherein the integrated circuit is one of a pulse limiting circuit or a processor.

7. The method of claim 1, wherein the first logical state is a logical 1 and the second logical state is a logical 0.

8. The method of claim 1, wherein the second portion of switches comprises:
   a first digital switch, also in the first portion, coupled to an inverter and a second digital switch, and gated on in response to the first clock signal being in the second logical state; and
   the second digital switch coupled to a logical 1 power supply and to the first digital switch, and gated on in response to a portion of the third portion of switches being gated off, wherein in response to the first digital switch and second digital switch being gated on, the logical 1 power supply drives the second clock signal to the second logical state.

9. The method of claim 8, wherein the third portion of switches comprises:
   a third digital switch coupled to the logical 1 power supply and a fourth digital switch, and gated by an inverse of the signal, wherein the third digital switch is gated on in response to the signal being in the first logical state;
   the fourth digital switch coupled to the third digital switch and gated by the first clock signal, wherein the fourth digital switch is gated on in response to the first clock signal being in the second logical state; and
   a fifth digital switch coupled to logical 0 ground and an inverter, and gated by the fourth digital switch, wherein the fifth digital switch is gated on and transitions the signal to the second logical state in response to the third and fourth digital switches being gated on.

10. The method of claim 9, wherein the fifth portion of switches comprises:
    the third digital switch coupled to logical 1 voltage supply and gated by an inverse of the signal, wherein the third digital switch is gated off in response to the signal being in the second logical state;
    the fourth digital switch coupled to the third digital switch and gated by the first clock signal, wherein the fourth digital switch is gated off in response to the first clock signal being in the first logical state;
    the fifth digital switch coupled to logical 0 ground and gated by the fourth digital switch, wherein the fifth digital switch is gated off in response to the fourth digital switch being gated off;
    a sixth digital switch, also in the first portion, coupled to an inverter and gated by the first clock signal, wherein the sixth digital switch is gated on in response to the first clock signal being in the second logical state;
    a seventh digital switch coupled to a logical 1 power supply and the sixth digital switch, and gated by the fourth digital switch, wherein the seventh digital switch is gated on in response to the fourth digital switch being gated off; and
    wherein in response to the sixth and seventh digital switches being gated on, the sixth digital switch maintains the second clock signal at the first logical state.

11. The method of claim 1, wherein the step of transitioning the second clock signal to the first logical state comprises inverting the signal from the second logical state to the first logical state, thereby transitioning the second clock signal to the first logical state.

12. The method of claim 1, wherein the fourth portion of switches comprises a digital switch, also in the first portion, wherein the digital switch is gated on in response to the first clock signal being in the first logical state, the digital switch being coupled to a logical 0 ground and an inverter such that when gated on, the digital switch drives the second clock signal to the first logical state.

13. An integrated circuit for altering a duty cycle of a first clock signal, the integrated circuit having a plurality of switches and comprising:
    a first portion of the switches configured to receive the first clock signal, wherein the first clock signal has a first pulse width;
    a second portion of the switches configured to transition a second clock signal to the second logical state at substantially time t, in response to the first clock signal transitioning from a first logical state to a second logical state at time t;
    a delay element configured to propagate a signal in the first logical state at substantially time t, wherein the delay element has a propagation delay time t1;
    a third portion of the switches configured to transition the signal to the second logical state, at substantially the end of time t+t1, in response to the propagation delay time t1 being less than the first pulse width of the first clock signal;
    the second clock signal configured to transition to the first logical state in response to the signal transitioning to the second logical state at substantially the end of time t+t1;
    a fourth portion of the switches configured to set the second clock signal in the first logical state at substantially time t2, in response to the clock signal transitioning from the second logical state to the first logical state at time t2;
    the delay element further configured to propagate the signal in the second logical state at substantially time t2; and
    a fifth portion of the switches configured to prevent the second clock signal from transitioning to the second logical state at substantially the end of time t2+t1, in response to the propagation delay time t1 of the delay element being less than the first pulse width of the first clock signal.

14. The integrated circuit of claim 13, further comprising:
    a sixth portion of the switches configured to transition the second clock signal in substantial accordance with the first clock signal, such that the duty cycle of the first clock signal is substantially identical to a duty cycle of the second clock signal, in response to the propagation delay time t1 being equal to or greater than the pulse width of the first clock signal.

15. The integrated circuit of claim 13, wherein the first portion of switches comprises four digital switches, wherein two digital switches are gated on and two digital switches are gated off in response to the first clock signal transitioning to the first logical state.

16. The integrated circuit of claim 13, wherein the delay element comprises at least two delay blocks coupled in series, wherein each delay block inverts the signal.

17. The integrated circuit of claim 16, wherein each delay block comprises at least a multiple of four NAND gates coupled in series.

18. The integrated circuit of claim 13, wherein the integrated circuit is one of a pulse limiting circuit or a processor.

19. The integrated circuit of claim 13, wherein the first logical state is a logical 1 and the second logical state is a logical 0.

20. The integrated circuit of claim 13, wherein the second portion of switches comprises:
  a first digital switch, also in the first portion, coupled to an inverter and a second digital switch, and gated on in response to the first clock signal being in the second logical state; and
  the second digital switch coupled to a logical 1 power supply and to the first digital switch, and gated on in response to a portion of the third portion of switches being gated off, wherein in response to the first digital switch and second digital switch being gated on, the logical 1 power supply drives the second clock signal to the second logical state.

21. The integrated circuit of claim 20, wherein the third portion of switches comprises:
  a third digital switch coupled to the logical 1 power supply and a fourth digital switch, and gated by an inverse of the signal, wherein the third digital switch is gated on in response to the signal being in the first logical state;
  the fourth digital switch coupled to the third digital switch and gated by the first clock signal, wherein the fourth digital switch is gated on in response to the first clock signal being in the second logical state; and
  a fifth digital switch coupled to logical 0 ground and an inverter, and gated by the fourth digital switch, wherein the fifth digital switch is gated on and transitions the signal to the second logical state in response to the third and fourth digital switches being gated on.

22. The integrated circuit of claim 13, wherein transitioning the second clock signal to the first logical state comprises inverting the signal from the second logical state to the first logical state, thereby transitioning the second clock signal to the first logical state.

23. The integrated circuit of claim 13, wherein the fourth portion of switches comprises a digital switch, also in the first portion, wherein the digital switch is gated on in response to the first clock signal being in the first logical state, the digital switch being coupled to a logical 0 ground and an inverter such that when gated on, the digital switch drives the second clock signal to the first logical state.

24. The integrated circuit of claim 23, wherein the fifth portion of switches comprises:
  the third digital switch coupled to logical 1 voltage supply and gated by an inverse of the signal, wherein the third digital switch is gated off in response to the signal being in the second logical state;
  the fourth digital switch coupled to the third digital switch and gated by the first clock signal, wherein the fourth digital switch is gated off in response to the first clock signal being in the first logical state;
  the fifth digital switch coupled to logical 0 ground and gated by the fourth digital switch, wherein the fifth digital switch is gated off in response to the fourth digital switch being gated off
  a sixth digital switch, also in the first portion, coupled to an inverter and gated by the first clock signal, wherein the sixth digital switch is gated on in response to the first clock signal being in the second logical state;
  a seventh digital switch coupled to a logical 1 power supply and the sixth digital switch, and gated by the fourth digital switch, wherein the seventh digital switch is gated on in response to the fourth digital switch being gated off; and
  wherein in response to the sixth and seventh digital switches being gated on, the sixth digital switch maintains the second clock signal at the first logical state.

* * * * *